United States Patent [19]

McGrath et al.

[11] Patent Number: 6,074,803
[45] Date of Patent: Jun. 13, 2000

[54] BONDING INNER LAYERS IN PRINTED CIRCUIT BOARD MANUFACTURE

[75] Inventors: Peter Thomas McGrath, Surrey, United Kingdom; Wolfgang Hetterich, Altdorf, Germany

[73] Assignee: Alpha Metals Limited, United Kingdom

[21] Appl. No.: 08/976,906

[22] Filed: Nov. 24, 1997

Related U.S. Application Data

[63] Continuation of application No. 08/322,503, Oct. 14, 1994, abandoned.

[30] Foreign Application Priority Data

Oct. 14, 1993 [GB] United Kingdom .................... 9321186
Jun. 21, 1994 [GB] United Kingdom .................... 9412457

[51] Int. Cl.$^7$ ...................................................... H05K 3/46
[52] U.S. Cl. ...................... 430/311; 430/313; 430/280.1; 430/281.1; 156/273.5; 156/275.5; 156/273.9
[58] Field of Search ............................. 430/280.1, 281.1, 430/311, 313; 156/290, 291, 205, 330, 307, 273.3, 273.9, 275.5, 272.1

[56] References Cited

U.S. PATENT DOCUMENTS

| | | | |
|---|---|---|---|
| 3,956,043 | 5/1976 | Zahir et al. ................................... | 156/3 |
| 4,038,084 | 7/1977 | Nakano et al. ............................ | 96/115 |
| 4,074,008 | 2/1978 | Green ....................................... | 428/418 |
| 4,933,259 | 6/1990 | Chihara et al. ....................... | 430/287.1 |
| 4,948,700 | 8/1990 | Maeda et al. .......................... | 430/280.1 |
| 5,009,982 | 4/1991 | Kamayachi et al. ..................... | 430/280 |
| 5,055,378 | 10/1991 | Miyamura et al. ...................... | 430/280 |
| 5,178,988 | 1/1993 | Leech et al. .......................... | 430/280.1 |
| 5,229,252 | 7/1993 | Flynn et al. .......................... | 430/280.1 |

FOREIGN PATENT DOCUMENTS

| | | |
|---|---|---|
| 0 275 071 | 7/1988 | European Pat. Off. . |
| 0 323 563 | 7/1989 | European Pat. Off. . |
| 0 403 170 | 12/1990 | European Pat. Off. . |
| 0 514 630 | 11/1992 | European Pat. Off. . |
| 0 515 861 | 12/1992 | European Pat. Off. . |
| 0 570 094 | 11/1993 | European Pat. Off. . |
| 2 197 301 | 3/1974 | France . |
| 3 838 562 | 5/1989 | Germany . |
| 3 925 895 | 2/1990 | Germany . |
| 2 193 730 | 2/1988 | United Kingdom . |

OTHER PUBLICATIONS

Technical Data Sheet for Albiset 202.
Ashford, Ashford's Technical Dictionary of Industrial Chamicals, 1994.
Patent Abstracts of Japan, vol. 17, No. 516 (C–1112) Sep. 17, 1993 (JP–A–05 140 251).
Technical Information Sheet for ALBISET 202 (publication date, if any, unknown).
Schering, "Oberflächenschutz II", pp. 3–5, 1989.
Union Carbide, "Cycloaliphatic Epoxide Systems", pp. 12–13, 1989.

(List continued on next page.)

*Primary Examiner*—Martin Angebranndt
*Attorney, Agent, or Firm*—Mintz, Levin, Cohn, Ferris, Glovsky and Popeo, P.C.

[57] ABSTRACT

A process for manufacturing a multi-layer circuit board comprises applying a layer of a photo-resist to the conducting surface of an inner-layer and fixing the resin composition in a pre-selected pattern for example by exposing to UV radiation which results in polymerization in the exposed areas. After removing the non-fixed areas by developing in an aqueous developing solution and etching in an etching solution, the fixed areas of resin composition remain in place on the inner-layer and are directly adhered to the neighboring insulating layer in an adhesion step.

The preferred resin compositions according to the invention comprise a first photo-polymerizable resin component having an acid number from 15 to 75, a second epoxy resin component having unreacted epoxy groups, and a photoinitator, the ratio or first to second resin components being at least 1:1.

20 Claims, 1 Drawing Sheet

OTHER PUBLICATIONS

DeForest, *Photoresist: Materials and Processes*, McGraw–Hill, 1995, pp. 47–61.

Reardon, Jr. et al., "October Project—Development of a Permanent Innerlayer Photoresist (PILPR)", pp. P8–5–1–P8–5–15 (publication date, if any, unknown) Nov. 1993.

Degussa Trade Literature, "Radiation Curing", pp. 12–13 (publication date unknown, suspected 1978).

Ashford, *Ashford's Dictionary of Industrial Chemicals*, Wavelength Publications Ltd., 1994, entries for Bisphenol A Glycidyl Ether Prepolymers and Epoxy–Novolac Resins.

Smith, "Water Absorption in Glass Fibre–Epoxide Resin Laminates," *Circuit World*, vol. 14, No. 3, 1988, pp. 22–26.

Lea et al, "Blowholding in PTH SOlder Fillets, Part 8, The Scientific Framework Leading to Recommendations for Its Elimination," *Circuit World*, vol. 13, No. 3, 1987, pp. 11–20.

Rodriguez et al, "Fine Line Resolution Solder Mask," *Proceedings of the EIPC Winter Conference (PCB Applications: New Processes, DEM, and FAr East Challenges)*, Zurich, Dec. 11, 1991, pp. 3–4–1 to 3–4–7.

Klose, "Fotoresist–Basismaterialien vereinfachen Fertigung von Mehrlagen–Leiterplatten," *Elektronik*, vol. 29, No. 25, 1980, pp. 96–98.

Fig.1D.

BONDING INNER LAYERS IN PRINTED CIRCUIT BOARD MANUFACTURE

This application is a continuation of application Ser. No. 08/322,503, filed Oct. 14, 1994, entitled Bonding Inner Layers In Printed Circuit Board Manufacture, now abandoned.

FIELD OF THE INVENTION

This invention relates to the Manufacture of multilayer printed circuit boards (PCBs).

BACKGROUND OF THE INVENTION

In the manufacture of a printed circuit board (PCR), in a first (multi-step) stage a "bare board" is prepared and in the second (multi-step) stage, various components are mounted on the board. The bare board is often a multi-layer board, generally comprising a first, inner-layer which is usually an epoxy-bonded fibreglass sub-layer clad on one or more usually both sides, with a conducting sub-layer. The conducting sub-layer usually comprises conducting material which is metal foil and most usually copper. The conducting material is generally a discontinuous sub-layer in the form of the circuit pattern. On at least one, and generally on both sides of the inner layer, an outer (or further) layer is attached. An outer layer will comprise at least a layer of an insulating material, again, generally epoxy-bonded fibreglass which is bonded to the conducting sub-layer of the innerlayer. The outer layer may additionally comprise at least one conducting sub-layer. The outer layer or layers are insulating layers or are adhered to the conducting sub-layer of the first inner layer with an insulating layer or sub-layer innermost to the first layer.

A multi-layer board therefore comprises a laminate in which conducting sub-layers are separated by insulating layers or sub-layers. The laminates are formed by adhering layers together. The layers which form the laminate may be conducting or insulating only or more usually are made up from sub-layers: at least one insulating and at least one conducting sub-layer. Generally conducting sub-layers are only provided on an insulating sub-layer due to their fine, fragile nature.

Various difficulties have been noted in trying to permanently bond the copper circuit pattern surface and an insulating organic substrate together. The copper surface tends to oxidise on exposure to the atmosphere to form a tarnished layer on its surface. If the next layer is adhered directly to this tarnished layer of copper, the bond will be weak and eventually will fail.

The most commonly used method for overcoming this problem is to remove the tarnish layer and form a strongly adherent copper oxide layer.

BRIEF DESCRIPTION OF THE DRAWINGS

A process is described below, with reference to the accompanying FIGS. 1A to 1G to show a conventional negative working type of process for making this type of multi-layer board.

In this example, the inner-layer (or first layer) comprises an insulating sub-layer having a conducting sub-layer on each side and the outer layers (or second layers) are insulating only. Although other conductive materials may be used in this type of process, the conducting sub-layers in this example comprise copper foil. The insulating layers in this example are epoxy-bonded fibreglass. The material of the outer layers is known as pre-preg and generally comprises a higher proportion of epoxy resin relative to the fibre glass than the sub-layer of the inner layer.

Figure 1A:
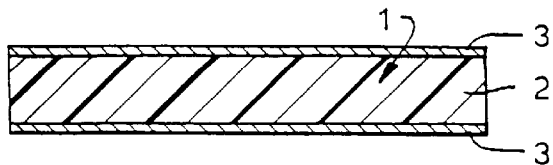
Figure 1B:
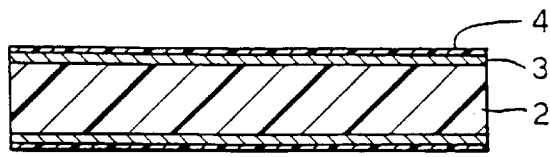
Figure 1C:
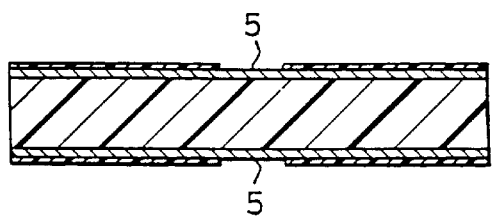
Figure 1E:
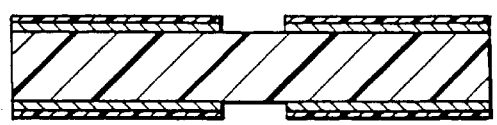
Figure 1F:
Figure 1G:
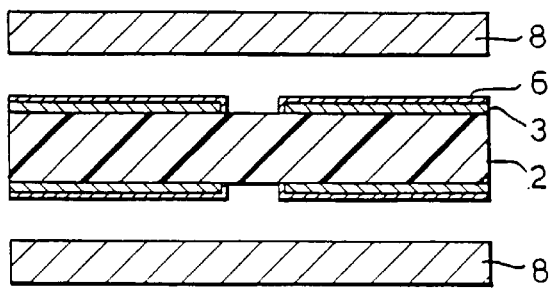

The inner-layer 1, (illustrated in FIG. 1A), comprising insulating sub-layer 2 and copper foil layers, 3 is coated on each side with a light-sensitive film 4 (shown in FIG. 1B) which is exposed to light in pre-selected areas. The unexposed film is then removed by developing to leave a pre-selected pattern of exposed copper 5, as illustrated in FIG. 1C. The areas of the copper which are revealed are generally the areas which are to be etched away, to leave the desired circuit pattern of the copper in the pattern corresponding to the cured photo-resist. The unwanted copper areas are then etched away using a chemical etchant, resulting in the arrangement illustrated in FIG. 1D. At this stage, the photo-resist remaining is chemically removed to result in the arrangement illustrated in FIG. 1E and the revealed copper surface is cleaned to remove any tarnishing from the copper surface. A black or brown oxide layer 6 is then formed on the cleaned copper surface (as shown in FIG. 1F) and then as shown in FIG. 1G the two outer layers 8 are then placed onto the black or brown oxide coatings on each side of the inner-layer, respectively. The laminate is then formed by pressing the layers together and applying heat so that the insulating sub-layer (pre-preg material) of outer layers 8 flows and provides adhesion to the brown or black oxide coating.

Additional conducting sub-layers (or cap layers), may also be added to the laminate. To do so, an additional layer comprising a conducting sub-layer, generally copper which has been pre-treated by a passivation step for example a zinc, tin, chromium or molybdenum passivation step is placed onto the outside of the pre-preg, prior to applying pressure and heat. On application of heat and pressure, the pre-preg (outer layers) adheres to the inner-layer and the additional layers adhere to the pre-preg substantially simultaneously.

Thus, as will be seen from the description above, generally, after etching and removal of the photo-resist layer, the exposed copper surface which is in the form of a circuit pattern, is cleaned to remove the tarnish layer and then the copper surface is immersed in hot, strongly alkaline, hypochlorite solution generally at temperatures of around 40 to 110° C. This results in the formation of the "black or brown oxide" layer which not only forms a strong bond with the copper surface but also has a high surface area so that organic films such as adhesives for laminating layers in a multi-layer circuit board can be bonded with a strong bond.

However, this process may be problematic because the formation of the black oxide layer must be carefully controlled to ensure formation or a coating which will give good adhesion after lamination. Furthermore, these black oxide layers are subject to attack by solutions which dissolve copper oxide such as the pre-treatment solutions for the electroless plating processes which are often acidic. The dissolution of the copper oxide may result in delamination. This problem is known as "pink ring" because a pink ring of copper can be seen in the black oxide coating on the copper.

Attempts have been made to overcome these problems by adapting the oxide coating. The most commonly used procedure is to incorporate an additional reducing step, further complicating the processes.

An alternative coating method has been described in EP-A-0,275,071 where after etching and then removal of the photo-resist, the copper surfaces are, as in the usual processes cleaned to remove any traces of tarnish, but after cleaning instead of forming a black oxide layer, a primer for the adhesive is applied directly to the copper. The primer comprises a layer of poly(vinylacetal)-phenolic resin. This process largely follows the conventional preparation process and simply provides an alternative for black oxide.

Therefore, an with the black oxide type processes, the process is lengthy and requires a large number of production steps.

It is known to use meth(acrylate)-based resins for forming the photo-resist, for example, see GB-A-2193730. However, the photo-resist compositions described in this reference are for use in conventional processes where the resist is removed prior to cleaning or the copper surface and preparation for lamination as described above.

It in also known to use epoxy-acrylate- or acrylate-based resins for forming a solder mask. The solder mask is used at a later stage in the bare board manufacture when the bare board is almost complete and the outer surfaces are being prepared for passing to the next component attachment stage. These types of solder mask are described in "Fine Line Resolution Solder Mask" by S. Rodriquez and K. Cheethan published in the Proceedings of the EIPC Winter Conference (PCB Applications: New Processes, OEM and Far East Challenges) Zurich 11.12.91 p. 3-4-1 to 3-4-7.

EP-A-514,630 also describes an epoxy-acrylate solder mask composition and EP-A-515,861 describes epoxy-based inks which are used to form a protective coating on circuit boards.

However, in all of these references, the resist or mask provides a protective function only and in particular, the photo-resist after having fulfilled its protective function is removed.

In an attempt to overcome the problems of the prior art systems and to form a simplified process for ensuring good adhesion within the laminated multi-layer PCBs, photo-resist have bean developed which after etching of the copper, does not have to be removed, but can remain in place. The pre-preg is then adhered to the remaining photo-resist in the adhesion step.

Such processes for manufacturing multi-layer circuit boards are described in "Elektronik, vol. 29, no. 25, December 1980 p 96–98, "Fotoresist-Basismaterialien vercinfachen Fertigung von Mehrlagen—Leiterplatten" by W. Klose, U.S. Pat. No. 4,074,008 and U.S. Pat. No. 3,956,043 (equivalent to FR-A-2197301). The article by Klove describes the use of an epoxy resin, "Probimer 48" from Ciba Geigy which is described as having photo-crooslinking groups so that in a first step, the resin can be exposed to UV radiation for photocuring and in a subsequent step a thermal hardening reaction in used to form the multi-layer board. In U.S. Pat. No. 3,956,043 and U.S. Pat. No. 4,074,008 photopolymerisable epoxide resins are described which polymerise on exposure to actinic radiation and which can be subsequently crosslinked by heat curing agents for epoxide resins. It in disclosed that these my be used for forming multi-layer circuit boards and that they do not have to be stripped off but can remain in place. The resins described in U.S. Pat. No. 4,074,008 are said to provide an improvement over the prior art epoxide resins because they have a higher epoxide group content, so provide better adhesion.

Such photo-resists are known as permanent or bonding resists. However, the bonding resists disclosed in each of these references have significant limitations. They have been found to provide PCBs which tend to delaminate. It is thought that this is largely due to "outgassing" on use whereby gases, generally water vapour, become trapped between the layers of the laminate either at the boundary between resist and metal layers, or within the resist itself in particular in humid conditions. On subsequent heat treatment of laminated PCBs for example in a soldering step, outgassing occurs resulting in delamination of the board and/or damage to plated through-holes in the board.

Furthermore, the known permanent (or bonding) resists require organic solvent developing to remove the non-fixed areas of resin in the developing step after UV curing of the resin. The use of organic solvent developing is disadvantageous both because of the safety problems involved and the environmental costs concerned.

The present invention aims to overcome the problems of the prior art systems for multi-layer board manufacture.

SUMMARY OF THE INVENTION

The present invention provides a process for manufacturing a multi-layer circuit board comprising obtaining a first layer which comprises at least one insulating sub-layer and at least one conducting sub-layer;

applying a layer of a resin composition to the surface or the conducting sub-layer;

in a fixing step, fixing the resin composition in a pre-selected pattern to form selectively a fixed pattern of resin composition which is etch-resistant and a non-fixed pattern of resin composition;

then in a developing step, contacting the non-fixed pattern or resin composition with an aqueous developing solution to effect removal of the non-fixed pattern of resin thereby revealing the areas of conducting sub-layer for etching;

etching the revealed areas of conducting sub-layer by contact with an etchant;

contacting an insulating second layer with the fixed, etch-resistant resin composition; and in a final adhesion step, adhering the first and second layers to one another.

In accordance with the present invention, there is also provided a multi-layer circuit board comprising a first layer, etch-resistant resin and an insulating second layer in which the first layer comprises an insulating sub-layer and a conducting sub-layer, the first layer being adhered to an insulating second layer so that the etch-resistant resin composition is in direct contact with both the conducting sub-layer and the insulating second layer, and wherein the etch-resistant resin composition is formed from a resin composition comprising a first resin component comprising photopolymerisable groups and having an acid number of from 15 to 75, a second resin component comprising unreacted epoxy groups and a photoinitiator, the weight ratio or first resin component to second resin component being at least 1:1, preferably at least 3:2.

Thus, it has been found that according to the process of this inventions a multi-layer board having good adhesion can be formed in a considerably simplified process. The multilayer boards produced have good adhesion even on exposure to thermal shock conditions, such as in one or more subsequent soldering steps.

Compared with the prior art processes, the process of the present invention enables the etch-resistant resin, generally a photo-resist, to remain in place and to take part in the adhesion or the two layers so that the process steps involved in forming a multi-layer PCB can be considerably reduced: steps of removing the etch-resistant rosin, cleaning the exposed copper surfaces, and applying a primer (either copper oxide or some other layer) prior to laminating the layers together, can all be omitted. Organic solvents are not required in the developing step, thereby reducing safety and waste disposal problems.

Furthermore, because the process according to the present invention does not require the use of a copper oxide layer, the problem of "pink ring" in the prior art processes does not arise as the adhesion promoter is resistant to the plating processes.

DETAILED DESCRIPTION OF THE INVENTION

The first layer is the inner-layer of a circuit board and may comprise one insulating sub-layer having a conducting sub-layer (generally copper foil) on one side only, or on each aide. The insulating second layer is sometimes referred to as an outer layer in the PCB industry, generally being a prepreg layer. Where the inner-layer has two conducting sub-layers, the bonding resist may be applied to both conducting sub-layers as described in the process above and two outer layers may be applied, one to each of the conducting sub-layers.

As many layers as are required can be built-up into a composite, multi-layer. However, the general principle is that conducting layers and insulating layers should be alternate.

As explained above, the conducting sub-layers in the finished multi-layer board, will generally not comprise continuous conducting material as they are generally the discontinuous pattern of conducting material remaining after etching, in the form of a circuit pattern.

In the process of this invention, the resin composition is applied to the surface of the conducting sub-layer by any conventional means. Generally, the resin composition will be in a liquid form, for example having a viscosity of from 50 to 10,000, preferably greater than 100 and most preferably greater than 500 cps. Where the resin composition in supplied in the form or a liquid, the viscosity will generally be below 2000, or even 1500 cps. Liquid resin compositions can be applied by any conventional coating technique such as screen printing, roller coating, electrostatic spraying or curtain coating. The appropriate viscosity can be selected for the chosen application method, or vice versa. More viscous liquids are used for screen printing than for example spaying, dip coating or curtain coating application techniques. Alternatively, the composition may be applied in a dry form, for example a pre-formed layer may be prepared on a support film and then adhered to the conducting layer in a method conventional for photo-resists, for example as described in GB 2,193,730, the supporting layer then being removed.

Generally, prior to application or the resin composition to the conducting sub-layer, the conducting sub-layer undergoes a pre-treatment cleaning step. The cleaning step may be either a mechanical cleaning stop such as brushing or pumice scrubbing, or a chemical step in which the conducting sub-layer is contacted with a chemical cleaning composition which is generally an acidic composition.

After application of a liquid resin composition, there will generally be a drying step in which any solvent is driven off, leaving a dry layer of photo-resist resin composition. The dry coating thickness of the resin composition is generally from 3 $\mu$m to 5 $\mu$m, preferably from 7 $\mu$m to 20. It has been found that at dry resin thicknesses below 7 $\mu$m, the cover over the conducting sub-layer may be unreliable so that the conducting layer may break through. Whilst resist thickness of greater than 20 $\mu$m may be provided, they have not been shown to give any additional benefit and may tend to cause bond failure after formation of multi-layer laminate. Preferably, the coating thickness will be at least 9 $\mu$m and most preferably at least 10 $\mu$m. Preferably the thickness of the resin composition will be no greater than 18 $\mu$m, preferably no greater than 15 $\mu$m.

The drying step is generally carried out by exposing the coated first layer to hot air, for example by passing coated first layers through a forced air dryer, or otherwise exposing to forced air drying. Generally the drying temperature will be no greater than 120° C., preferably no greater than 100° C. and most preferably no greater than 90° C. and should not be so high and/or for such length of time to activate the adhesion step prematurely.

In the fixing step, the resin composition is fixed to form selectively non-fixed and fixed etch-resistant areas by selective exposure to or contact with a reaction promoter for the resin composition.

Preferably the resin composition is a radiation-curable composition and the reaction promoter is radiation, such as electron beam curing or actinic radiation and most preferably UV light. The fixed, etch-resistant pattern preferably forms in the areas which are contacted with or exposed to the reaction promoter so that the areas not contacted or exposed to the reaction promoter form the non-fixed pattern. This is a conventional negative working process. Alternatively, the fixed etch-resistant pattern may form from the areas of the resin composition which are not contacted with or exposed to the reaction promoter. In this case, the reaction promoter produces a reaction in the areas of resin composition which are exposed or contacted with it, the reaction resulting in those areas of the resin composition becoming soluble in a developing liquid used in the developing step for removing the non-fixed pattern. This latter process is known as positive working.

Preferably the fixing step is a negative working step where the reaction promoter produces polymerisation or any other curing which fixes the areas of the resin composition exposed to, or contacted with the reaction promoter.

In the developing step, the non-fixed areas of the resin composition are removed leaving a pattern of fixed, etch-resistant resin composition and a pattern of exposed conducting sub-layer. Alkaline developing and solvent developing are well known developing techniques for conventional photo-resists which are stripped off prior to adhesion of various layers to form a multilayer or PCB. Alkaline developing solutions are aqueous and may comprise a weak alkali such an for example potassium carbonate or a solvent developing solutions may comprise a solvent such as butyl diglycol. An example of solvent developing is given in EP-A-514,630. An example of aqueous alkaline development is described by Rodriguez and Cheatham (referenced above) specifically for protective solder masks.

As explained above, organic solvents tend to be problematic. However, the known bonding resists, as well as tending to provide inadequate lamination especially on exposure to beat shock conditions, are all dependent on organic solvent developing. In the present invention for bonding resists however, this problem can be overcome and the developing solutions may be aqueous alkaline developing solutions, comprising one or more weakly alkaline salts such as alkali metal carbonates, preferably potassium or sodium carbonate. Generally the concentration of the weakly alkaline salt will be from 0.5–20% by weight, generally around 0.5–5% by weight in the aqueous developing solution.

In the developing step, the developing solution generally contacts at least the non-fixed areas of the dry resin composition. Contact may be by any conventional means but is generally by immersion or spraying with the developing solution, generally by spraying. The developing step is carried out for sufficient time to enable the non-fixed areas of the resin composition to be removed from the conducting sub-layer, revealing the areas of conducting sub-layer for etching and the fixed (cured) pattern of resin composition which is etch-resistant.

As explained above, in a preferred process of the invention, the reaction promoter is light, especially UV light and the process is a negative working process. Thus, in accordance with a preferred process of the present invention, a multi-layer circuit board is manufactured, the process comprising: obtaining a first layer which comprises at least one insulating sub-layer and at least one conducting sub-layer; applying a layer of a resin composition to the surface of the conducting sub-layer; in a fixing step, exposing the resin composition in a pre-selected pattern to light, preferably UV light, to produce a reaction in the resin composition which forms a fixed pattern of resin composition in the areas exposed to light and a non-fixed pattern of resin composition remaining in the areas of the resin composition which have not been exposed to light; then in a developing step, contacting the non-fixed pattern of resin composition with an aqueous developing solution to effect removal of the non-fixed pattern of resin thereby revealing the areas of conducting sub-layer for etching; etching the revealed areas of conducting sub-layer by contact with an etchant; contacting an insulating second layer with the fixed resin composition; and in a final adhesion step, adhering the first and second layers to one another.

Where the developing step tends to soften the exposed parts of the resin, optionally a post-development bake step may be included in the process to increase hardness of the fixed areas of photo-resist resin. This may be necessary to increase the etch-resistance or the resin prior to contact of the assembly with etchant to remove the unwanted areas of conducting sub-layer.

However, if this step is required, it is important that the post-development bake does not reach temperatures which will substantially activate any latent catalyst which may be present in the resin composition for the adhesion step, or otherwise activate the resin composition prematurely so that it will not adhere in the subsequent adhesion step. Preferably therefore if necessary, the post-development bake should not exceed temperatures above 100° C., most preferably it should not exceed temperatures above 80° C.

Prior to contact with the etchant, the fixed areas of resin composition will be etch-resistant so that they are resistant to an etchant at least for the time taken to etch away the unwanted areas of conducting sub-layers to form the circuit pattern of the first layer. Several different chemical types or etchant are known and used; preferably the etch-resistant resin composition in resistant to more than one type of etchant or even to all types. A preferred etch-resistant composition is resistant to acidic etchant which may comprise for example iron II chloride or copper chloride. An additional preferred composition is resistant to alkaline etchant which may be for example based on ammonium compounds, such as a copper ammonium chloride complex in aqueuos ammonia.

Following etching or the exposed pattern of conductive material, the second layer(s), generally one or more prepreg layers are placed adjacent the etch-resistant composition which remains in place on top of the remaining pattern of conducting sub-layer and the two layers adhered to one another in the adhesion step. Generally, the composite is exposed to heat in an adhesion step which initiates the adhesion reaction.

In the adhesion step the bond strength between the copper or other conducting sub-layer is generally enhanced due to enhanced cross-linking within the resin; a bond forms between the resin composition and insulating, second layer both due to reaction in the resin composition, generally cross-linking, and mechanical bonding due to intermixing of the resin composition and the insulating, second layer due to any heat applied in the adhesion step.

Generally, pressure is also applied by placing layers which are to be formed into a multi-layer laminate of at least the first and second layers, in a press. Where pressure is applied it is generally from 100 to 400 psi, preferably from 150 to 300 psi. The temperature of this adhesion step will generally be from 100° C. to 250° C., preferably from 120° C. to 200° C. The adhesion step is generally carried out for any time from 5 minutes to 3 hours, most usually from 20 minutes to 1 hour, but is for sufficient time and pressure and at a sufficiently high temperature to ensure good adhesion between the first and second layers.

During this adhesion step, the resin of the insulating sub-layers (generally epoxy resin) tends to flow ensuring that the areas between the conducting areas of the conducting metal sub-layer revealing the insulating sub-layer of the first layer are filled. This ensures that the conducting sub-layer material is substantially sealed between insulating layers and subsequent penetration of water or air is avoided.

In addition in the adhesion step, any latent catalyst is activated so that further hardening of the resin, for example by cross-linking or polymerization reaction occurs in the resin composition. This ensures good adhesion between the conducting material of the conducting sub-layers and the insulating layer adjacent to it, forming a strong bond between the adjacent layers.

If desired, several layers may be placed together in the final adhesion step to effect lamination of several layers in a single step to form the multi-layer board. As will be seen, the present invention provides a considerably simplified process over the known processes and provides good protection of the copper or other conducting material and good adhesion, whilst overcoming the prior art problems of pink ring.

The present invention also includes a resin composition for forming a bonding resist and which is preferably used in the process of the present invention, the resin composition comprising a first resin component comprising photopolymerisable groups and having an acid number of from 15 to 75, a second resin component comprising unreacted epoxy groups, and a photoinitiator, the weight ratio or the first resin component to the second resin component being at least 1:1, preferably at least 3:2.

The composition optionally also comprises a latent catalyst.

Preferably the acid number of the first resin component is at least 25, more preferably at least 30. Preferably the acid number is no greater than 65 and most preferably no greater than 60.

The acidic groups which produce the desired acid number are preferably carboxylic acid and groups (either branched or terminal end groups) and the ethylenically unsaturated groups are preferably —C($R^3$)=C($R^3$)$_2$, where the $R^3$ groups are selected independently from H, $C_{1-4}$ alkyl groups and halogens, although halogens are not preferred. Preferably all three $R^3$ groups are hydrogen for example in acrylate end groups, or one $R^3$ group is $CH_3$, for example as in methacrylate and groups. The alkyl groups way be optionally substituted, for example with halogens such as chlorine or bromine.

The first resin component which comprises photo-polymerisable groups is preferably an epoxyacrylate or epoxy ($C_{1-4}$)acrylate (preferably epoxymethacrylate) or an epoxy resin which is an aromatic polyglycidyl ether having the structural formula I:

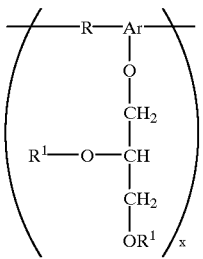

in which Ar is an optionally substituted aromatic group having from 1 to 4 phenyl rings;

R is a divalent hydrocarbon group, preferably having from 1 to 10 carbon atoms, most preferably having from 1 to 4 carbon atoms, or —O—, or —N ($R^2$)— (where $R^2$ is H or a $C_{1-4}$ hydrocarbon group, preferably $R^2$ is —$CH_3$), or, less preferably, combinations of these groups; and $R^1$ is a combination of H, acidic functional groups and ethylenically unsaturated groups, wherein $R^1$ is H for no greater than 30% of the total number of $R^1$ groups, $R^1$ is an acidic functional group in sufficient proportion to provide an acid number of from 15 to 75, most preferably from 25 to 65, or even from 30 to 60, and the remainder of the $R^1$ groups being ethylenically unsaturated groups; and x is preferably from 2 to 10.

Where the first resin component comprising photo-polymerisable groups has the formula I above, preferably up to 30% of the $R^1$ groups are H; from 4–95% or the $R^1$ groups are acidic functional groups and from 4–95% of the $R^1$ groups are ethylanically unsaturated groups. Preferably from 25–90% of the $R^1$ groups are acidic functional groups and ethylenically unsaturated groups, respectively. Preferably the acidic functional $R^1$ groups are —C(O)—OH and the ethylenically unsaturated functional groups are —CH or $CH_3$), preferably —CH=$CH_3$.

The first resin component is substantially free of unreacted epoxide groups. Although the first resin component is preferably an epoxy resin, the first resin component is preferably the reaction product of an epoxy compound so that substantially all the available epoxy groups were reacted during its formation.

The molecular weight of the photo-polymericable resin, especially where it is formed from the aromatic polyglycidyl ether or the formula I, is preferably no greater than 10,000 and most preferably at least 500 and no greater than 5000, or even no greater than 3000 (as determined by CPC).

Suitable (meth)acrylate resins are any conventionally used for forming conventional photo-resists or solder masks.

Suitable examples include unsaturated esters of an epoxy novolac resins are used where the unsaturated acid is (meth) acrylic acid, halogenated (meth)acrylic acid or hydroxyalkyl (meth)acrylate half esters of a di-acid.

The photo-initiator is incorporated in the composition to promote reaction of the ethylenically unsaturated groups in the photo-initiated step. The preferred photo-initiators are those which on irradiation, give an excited state that leads to formation of free radicals which then initiate polymerisation of the monomer, such as organic peroxides, hydrogen peroxides, alpha-substituted acetophenones such as 2,2-trichloro-4-tertiarybutyl acetphenone, benzoylphenylcarbonols and alkyl ethers thereof such as benzone and its alkyl ethers, benzophenones, benzil, acetals and mixtures of phenothiazine dyes or quinoxalines with electron donors. Preferred photoinitiators are benzophenones and/or acyl phosphines.

The photoinitiator is generally incorporated in the composition in amounts of from 0.5 to 15% by weight more usually from 1 to 10% by weight of the total resin composition.

The second resin component comprises an epoxy resin having unreacted epoxide groups which, in the adhesion step, on conditions of high temperature react to increase adhesion to the surface of the conducting sub-layer (generally copper) and to give good adhesion to the insulating, second layer.

The epoxy resin is any resin which contains unreacted epoxide groups and may be for example one or mixtures of more than one of epoxy-novolac resins, biphenyl A glycidyl ether prepolymers, bisphenol F diglycidyl ether prepolymers or bisphenol H diglycidyl either prepolymers or epoxy-novolac resins as descried in EP-A-514630.

The softening point of the second resin component is preferably from 60–90° C.

The resin composition for use in the prevent invention should be chemically compatible with the insulating layers in the final laminate produced by adhering the layers together.

Epoxy groups are the preferred functional groups for reacting in the adhesion step, and for forming the backbone in the first resin component because the resin contained in the second insulating layer (prepreg) and often also or sub-layers is generally epoxy-based and therefore the use of epoxy functionality ensures chemical compatibility during the bonding process. Furthermore, epoxy resins are known to have good thermal stability and electrical insulation properties.

The first and second resin components are generally incorporated in the composition of the invention in weight ratios of 2:1 to 6:1, preferably 2:1 to 4:1 and most preferably around 3:1.

Besides the specific first and second resin components mentioned above, the composition or the invention may optionally also comprise one, or mixtures of more than one additional photopolymerisable components to increase the cross-linking density in the resin composition during the adhesion step. The additional photopolymerisable component may be incorporated in the resin composition in amounts up to 25% by weight, but preferably in an amount no greater than 20% or most preferably in an amount below 15% by weight of the total composition. Any photopolymerisable monomer, dimer or oligomer may be used but particularly preferred are multi-functional compounds, such as (meth) acrylates such as TMPEOTA (trimethylol propane ethoxylate triacrylate) and/or TPGDA (tripropylene glycol triacrylate) and/or RCS 88'999 (a urethane acrylata resin) and/or Santolink AM 1150 (melamine acrylate).

The composition will generally contain components to provide a ratio of photopolymerisable to adhesion reactive epoxy groups of from 2:1 to 10:1, preferably 2:1 to 5:1 and most preferably around 3:1.

The composition preferably comprises 50–94% by weight first resin component and 5 to 49% by weight second resin component. More preferably, the composition should comprise from 50 to 89% by weight first resin component and from in to 49% second resin component.

The etch-resistant resin composition therefore preferably comprises an organic resin which has reacted in a polymerisation step and a cross-linking step, and in which at least some of the polymerisation or cross-linking has been initiated by exposure to radiation. Particularly preferred etch-resistant resin composition are those where the cross-linking of the resin is due to reaction of acid groups of an epoxy (meth) acrylate resin with the epoxide groups on a second resin component.

Using such preferred compositions in the process of the present invention, in the photo-initiated reaction step ethylenically unsaturated groups react to increase the average molecular weight of the resin composition producing the fixed areas.

The acidic groups in the resin composition provide aqueous developability and in the developing step, the lower molecular weight non-fixed areas are therefore developed away leaving the fixed areas in place on the conducting sub-layer. In the thermal adhesion step, reaction between the acid groups of the first resin component and the epoxy groups of the second resin component takes place to form a strong bond between the layers. The acidic groups in the resin composition have been found to ensure good contact to the conducting metal sub-layer.

The laminates produced are resistant to delamination even under heat shock conditions and compared with the prior art systems do not suffer from the problem of outgassing at problematic levels. It is postulated that the particularly good properties are due to the fact that reaction occurs between the two specified resin components which are in an intimate mixture, therefore ensuring reaction throughout the composition and reducing weak spots in the resist and ensuring that substantially no unreacted epoxide groups remain in the bonding resist. This, combined with the acidic nature or the resin composition ensures a particularly effective contact between the surface of the conducting sub-layer and the composition, which appears to minimize moisture uptake, thereby reducing the problem of out-gassing.

It is postulated that out-gassing in the prior art bonding resists may be due at least in part to unreacted epoxide groups in the resin composition which have an affinity for water.

Thus the preferred compositions comprise a first resin component having functional groups effective to photochemically react on exposure to a reaction promoter which is preferably UV radiation, in the fixing step and acidic groups effective to provide aqueous developability in the developing step; photoinitiator for the photoinitiated reaction; a second resin component comprising unreacted epoxide groups effective to react with acid groups on the first resin component in the adhesion step, and optionally latent catalyst to increase the rate of reaction in the adhesion step.

The composition preferably also comprises a latent catalyst for the adhesion step, to increase the rate of reaction in the adhesion step.

The optional latent catalyst is preferably incorporated in amounts up to 5% by weight, most preferably from 0.5 to 4% by weight. Suitable latent catalysts are catalysts for the reaction between the epoxy groups of the second resin component and the acid groups of the first resin component. Examples are blocked catalysts such as amine salts of sulphonic acids eg. morpholene salt of p-sulphonic acid.

A "latent" catalyst is one which remains substantially inactive during the first, photo-initiated polymerisation step, and does not become active as a catalyst for the polymerization of the functional groups for reaction in the adhesion step, until the adhesion stop. Generally, activation of the latent catalyst in the second polymerisation step is by heating at temperatures of above 120° C., or even above 140° C.

The resin composition which may be used in the present invention is generally prepared by mixing the resin components, photoinitiator and any other optional ingredients to form a substantially uniform composition, generally with solvent, such as glycol ethers or glycol ether acetates. Where necessary, fillers and other components may be milled either prior to incorporation in the mixture, which is preferred, or after addition, by milling the final composition.

Optionally the resin composition may also include binder, pigment defoaming agents and other non-interfering additives or fillers.

Examples of the present invention are given below.

EXAMPLE 1

A composition was prepared by forming a mixture of the following ingredients in the parts by weight quoted in Table 1:

TABLE 1

| Component | Parts by Weight |
| --- | --- |
| Albiset A210 (65%) (epoxy acrylate having acid functionality) supplied by Hanse Chemi | 480.00 |
| Novapintviolett A 511 (pigment) supplied by Pinova | 12.00 |
| Syloid ED 20 (filler) supplied by Grace | 15.00 |
| TMPEOTA (UV-curable trimethylpoly . . . component) supplied by Cray Valley | 30.00 |
| RCX 88'999 (UV-curable component) supplied by Rahn | 30.00 |
| Modaflow (50% in BG) (defoamer/leveller) supplied by Monsanto | 30.00 |
| Talkum Besta 10 (filler) supplied by Luzenac | 36.00 |
| Santolink AM 1150 (UV-curable component) supplied by Monsanto | 55.20 |
| Butylglycol (solvent) | 48.00 |
| Darocure 1173 (photo-initiator) supplied by Ciba Geigy | 12.00 |
| Irgacure 651 (photo-initiator) supplied by Ciba Geigy | 48.00 |
| Albiset B202 (epoxy resin) supplied by Hanse | 120.00 |
| Catalyst SD475 (latent catalyst) supplied by Air Products | 9.00 |

The components were stirred to form a substantially uniform composition.

The composition was than coated onto a pre-cleaned copper foil sheet of an inner-layer for a circuit board by screen printing and the coating was dried to drive off solvent in circulating air at a temperature of 80° C. for approx 10 minutes to leave a dried coating, having a thickness of 14 μm. Pre-selected areas of the composition were then exposed to UV light by covering with a negative and passing through a UV-oven so that a pre-selected pattern of the coating only was exposed to UV-light of an intensity of 5 KW for 30 seconds. The unexposed areas of the film were then removed by alkali-developing by immersing in a 2% aqueous solution of sodium carbonate at a temperature of 30° C. for 30 seconds. The exposed copper areas were then etched using a standard etching composition of ferric chloride and the etched inner layer was washed with water and dried.

The inner layer was then dried by forced air drying, and the neighbouring layer of the multi-layer board was placed on the remaining photo-resist, with the insulating layer inner most. The two adjacent layers were then placed in a press and a pressure of 250 psi was applied and heat was applied at 150° C. for 1 hour. The resulting composite had good adhesion in which the resin in the insulating layer had flowed to form a seal between the two layers.

The adhesion properties were tested according to IPC test method 2.4.6 and the results obtained were substantially the same or batter than the prior art laminates.

EXAMPLE 2

A bonding resist composition was prepared by forming the mixture of components as set out in Table 1 of example 1 with the exception that the 30 parts by weight TMPEOTA was replaced with 30 parts by weight TPGDA UV-curable monomer. In use, as described in example 1, the composition shows a slower UV-response than the composition of example 1 because the TPGDA is difunctional rather than trifunctional (TMPEDTA). However, curing is still achieved by exposure to UV-light of an intensity of 5 KW for 40 seconds. Good bonding resist properties were obtained.

EXAMPLE 3

A bonding resist composition was prepared as described in example 1, with the exception that the Novapint Violett A511 pigment was replaced with 2.0 parts by weight. Savinyl Violet™ pigment (supplied by Sandoz), and the amount or Syloid ED20™ of filler was increased from 15 to 30 pbw. Again good bonding resist proporties were obtained when the composition was used to form a multi-layer board, as described in example 1. It was noticed that dye was adsorbed onto the copper areas during developing of the resist and because of the increased amount of filler, the surface of the resist had a more matt appearance than that of the resists formed as described in examples 1 and 2, respectively.

EXAMPLE 4

A bonding resist composition was prepared as described in example 1 but with the exception that Albiset B202 was replaced with Albiset XP 9/14. Again, the composition formed an effective bonding resist. It was noted that the composition formed produced a somewhat harder film on drying and required a developing time slightly longer (by 10–5) than the developing time required for the composition of example 1.

EXAMPLE 5

A composition was prepared as defined in example 1 but with the exception that the 480 pbw epoxyacrylate resin (Albiset A210 (65% active)) or example 1 were replaced with 450 pbw of an epoxymethacrylate resin (PRO 1200 (70% active) supplied by Cray Valley. It was noted that the composition gave a slightly slower UV-response than the composition of example 1. However, cure was still obtained on exposure to UV-light of an intensity of 5 KW for 30 seconds. Good bonding resist properties were obtained.

EXAMPLE 6

Performance tests were carried out on a composition as described in table 1 of example 1, as follows:
Pretreatment
3 sets of innerlayer panels were given different surface preparation as follows:

Set a) Brushed

Set b) Microetched in a 100 g/l aqueous solution of sodium persulphate for (1 min) and subsequent acid dip in 5% sulphuric acid for 1 minute, followed by rinsing and drying.

Set c) Pumice scrubbed,
Printing

The panels were then printed with the composition of example using a 120T screen. The panels were transferred into the drying oven directly after printing. The panels were dried at 80° C. (circulating air oven), 5 minutes first side, and 10 minutes on the reverse. The panels were completely tack free.
Photo-Curing Exposure was done using a vacuum frame equipment with a 3 KW source.

Optimum exposure time was determined using a Dynachem step wedge, and was found to be about 30 light units (equivalent to 1 min.). This gave a break on the step wedge after development of about 5/6. It was noted that there was only a small change in the break point on the step wedge with a wide range of exposure times. The panels were spray developed in 1% sodium carbonate at 30° C.
Etching The panels were etched in MacDermid Ac-Cu Guard™ alkaline etchant.
Bonding The boards were then laid-up as follows:
Board A)
½ oz. Cu Foil
Isola 7628™ (Supplied by Isola) Prepreg
Innerlayer with bonding resist
Isola 7628™ Prepreg
½ oz. Cu Foil
Board B)
½ oz. Cu Foil
Isola 2113™ Prepreg
Innerlayer with bonding resist
Isola 2113™ Prepreg
Innerlayar with bonding resist
Isola 2113™ Prepreg
½ oz. Cu Foil Some of the innerlayers with bonding resist in place were "baked" at 50° C. for 10 min. before pressing to see if this has any beneficial effect.

The multi-layer press was a standard Burkle type without vacuum. The press temperature was 171° C. with a ram pressure of 71 bar (equivalent to 250 psi on the panels). The overall press cycle was about 1½ hours with 1 hour at maximum temperature and pressure.

After bonding the outer copper was etched away on two panels for the following thermal shock test. The remainder of the panels were sent for drilling and plating.
Thermal Shock One baked and one unbaked panel were tested by repeating cycling in a vertical hot air leveller (solder pot temperature 240° C.). After 30 seconds of levelling neither panel showed any sign of delamination. The baked panel was cycled for a further 30 seconds and still showed no signs of delamination.

EXAMPLE 7

Performance tests were also carried out with composition A (as described in example 4, but with the Albiset A210 replaced by the equivalent weight of Albiset XP9/126) and B (as described in example 4).

Various different layers were obtained, each having a copper toil on each side, each copper foil being 1 oz. per square foot. Inner layers having thickness of the insulating layer of 0.7 mm, 0.36 mm and 0.2 mm, respectively were tested. In addition, inner layers having an insulating layer of thickness of 0.2 mm were also tested which had on top of the 1 oz copper or plated copper to provide copper surfaces of up to 2 oz./square foot. All of the inner layer materials used were supplied by B.B Electronics.

Pretreatment

The 0.7 mm insulating layer inner layers were pretreated by the mechanical brushing; and the 0.36 mm and 0.2 mm insulating layer inner layers were all pumice scrubbed.

Printing

The panels were printed using the respective compositions A and B, by screen printing using a 100 T polyester mesh. In each case, the screen was double flooded before printing with either composition A or composition B. The panels were dried at 65–70° C. (circulating air oven), for 10 minutes on the first side and eight minutes on the second side.

Photo-curing

The panels were exposed on a circographic 5000. The inner layers were then exposed for 30 light units equivalent to one minute. This gave a Stuoffler step wedge of copper 8/9.

Developing

The panels were developed using a it sodium carbonate solution at 32° C. The panels were then developed at conveyor speed 320 mm/minute.

Etching

The panels were then etched in MacDermid amnoniacal etching solution at pH 8.2 and 45° C. Particularly good results were obtained with composition A.

Bonding

The treated inner layers were then bonded in a Burkle open press with the following cycle: four minute gel time at 170° C. and 10 bar ram pressure; 70 minute bond time at 170° C. and 71 bar ram pressure; and 30 minutes cool down time. The final multilayer boards were constructed as shown below.

Four Layer Multilayer 0.5 oz. cu Foil
Isola 7628 Prepreg
0.7 mm Inner layer with Cu and photoresist
Isola™ 7628 Prepreg
0.5 oz Cu Foil Six Layer Multilayer 0.5 oz Cu Foil
Isola™ 2113 Prepreg
Isola™ 2113 Prepreg
0.36 mm Innerlayer with Cu and photoresist
Isola™ 2113 Prepreg
Isola™ 2113 Prepreg
0.36 mm Innerlayer with Cu and photoresist
Isola™ 2113 Prepreg
Isola™ 2113 Prepreg
0.5 Cu Foil

COMPARATIVE EXAMPLE

Four Layer Multilayer Using Perstorp TM GE313 UT Innerlayer from BB Electronics 0.5 oz. Cu Foil
Isola™ 7628 Prepreg
Isola™ 7628 Prepreg
Innerlayer (Perstorp GE313 UT
0.2 mm, 2×35 μm) (BB Electronics)
Isola 7628 Prepreg
Isola 7628 Prepreg
0.5 oz. Cu Foil Thermal shock Testing The four layer multilayer according to the invention, as outlined above, was prepared using inner layers having photoresist formed from compositions A and B respectively. The four layer board was then given repeated hot air solder levelling in a Cemco Quick Silver machine at 252° C. After 37 seconds of solder immersion, neither board showed signs of delamination. From a comparison of the results obtained using the comparative four layer multilayer, it was concluded that the copper-bonding resist-prepreg bond gives very good adhesion which may be as strong as the copper-prepreg bond in the comparative example. The bond obtained using composition a was particularly good, although no further testing was carried out to determine whether the bond obtained using composition A was stronger than that between copper and the pre-preg in the comparative example.

We claim:

1. A process for manufacturing a multilayer circuit board, the process comprising the steps of:

(A) providing a first layer which comprises an insulating sub-layer and a conducting sub-layer;

(B) providing a first resin component that is substantially free of unreacted epoxide groups and has photopolymerisable groups;

(C) providing a resin mixture that includes a free-radical polymerization photoinitiator and a molecule having unreacted epoxide groups;

(D) combining the first resin component and the resin mixture to form a resin composition having from 50 weight percent to 94 weight percent of the first resin component and from 5 weight percent to 49 weight percent of the molecule having unreacted epoxide groups wherein the weight percentages are based upon the total weight of the resin composition;

(E) applying the resin composition to a surface of the conducting sub-layer to form a resin composition layer that is etchable;

(F) forming areas of the resin composition layer that are etch-resistant and leaving areas of the resin composition layer that are etchable;

(G) contacting the etchable areas of the resin composition layer with an aqueous developing composition to remove the etchable areas of the resin composition layer to reveal areas of the conducting sub-layer;

(H) etching the revealed areas of the conducting sub-layer;

(I) contacting a second layer with a surface of the etch-resistant areas of the resin composition layer; and (J) adhering the first layer to the second layer to form the multi-layer circuit board.

2. A process according to claim 1, wherein the photopolymerisable groups are ethylenically unsaturated groups.

3. A process according to claim 1, wherein the first resin component has an acid number of from 15 to 75.

4. A process according to claim 1, wherein the first resin component has an acid number of from 25 to 65.

5. A process according to claim 4, wherein the acidic groups providing the acid number are carboxylic acid end groups and the photopolymerisable groups are ethylenically unsaturated groups having a formula represented by: $-C(R^3)=C(R^3)_2$, wherein $R^3$ is selected from the group consisting of H, $CH_3$, and combinations thereof such that at least two of the $R^3$ groups are H.

6. A process according to claim 1, wherein the first resin component comprises a molecule selected from the group consisting of an epoxy acrylate or epoxy ($C_{1-4}$) acrylate and an epoxy resin which is an aromatic polyglycidyl ether having a molecular structure represented by:

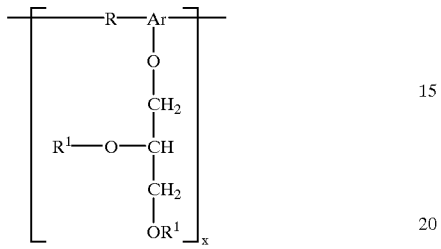

wherein Ar is an aromatic group having from 1 to 4 phenyl rings;

R is selected from the group consisting of a divalent hydrocarbon group having from 1 to 10 carbon atoms, 0, $N(R^2)$ and mixtures thereof, wherein $R^2$ selected from the group consisting of H and a $C_{1-4}$ hydrocarbon group; and each group represented by $R^1$ is selected from the group consisting of H, acidic-functional groups, ethylenically unsaturated groups and mixtures thereof, the groups represented by $R^1$ being selected such that H is at most 30% of the total number of $R^1$ groups, wherein the number of groups represented by $R^1$ that are acidic functional group is sufficient to provide aqueous alkaline developability, and wherein the remainder of the groups represented by $R^1$ are ethylenically unsaturated groups; and x is 2 to 10.

7. A process according to claim 6, wherein the first resin component comprises an aromatic polyglycidyl ether with at most 30% of the $R^1$ groups being H, from 4 weight percent to 95 weight percent of the $R^1$ groups being acidic functional groups having the formula —C(O)—OH, and from 4 weight percent 95 weight percent of the $R^1$ groups being ethylenically unsaturated groups.

8. A process according to claim 1 in which the resin mixture comprises an epoxy resin having unreacted expoxide groups selected from one or mixtures of more than one epoxy-novolac resins, bisphenol A glycidyl prepolymers, bisphenol F diglycidyl ether prepolyers or bisphenol H diglycidyl prepolymers.

9. A process according to claim 1 in which the resin mixture has a softening point of from 60° C. to 90° C.

10. A process according to claim 1 in which the weight ratio of the first resin component to the molecule having unreacted epoxide groups is from 1:1 to 6:1 and is preferably at least 3:2.

11. A method of manufacturing a multilayer circuit board, the process comprising the steps of:
(A) providing a first layer including an insulating sub-layer and a conducting sublayer;
(B) providing a first resin component that is substantially free of unreacted epoxide groups, the first resin component containing ethylenically unsaturated photopolymerisable groups, the first resin component having an acid number of from 15 to 75;
(C) providing a resin mixture that includes a free radical polymerization photoinitiator and a molecule having unreacted epoxide groups;
(D) combining the first resin component and the resin mixture to form a resin composition having from 50 weight percent to 94 weight percent of the first resin component and from 5 weight percent to 49 weight percent of the molecule having unreacted epoxide groups such that a weight ratio of the first resin component to the molecule having unreacted epoxide groups is from 1:1 to 6:1 wherein the weight percentages are based upon the total weight of the resin composition;
(E) applying the resin composition to a surface of the conducting sub-layer to form a resin composition layer that is etchable;
(F) forming areas of the resin composition layer that are etch-resistant and leaving areas of the resin composition layer that are etchable;
(G) contacting the etchable areas of the resin composition layer with an aqueous developing composition to remove the etchable areas of the resin composition layer to reveal areas of the conducting sub-layer;
(H) etching the revealed areas of the conducting sublayer; contacting a second layer with a surface of the etch-resistant areas of the resin composition layer; and
(I) adhering the first layer to the second layer to form the multilayer circuit board.

12. The method according to claim 11, wherein the weight ratio of the first resin component to the molecule having unreacted epoxide groups is from 1:1 to 2:1.

13. The method according to claim 11, wherein the weight ratio of the first resin component to the molecule having unreacted epoxide groups is 3:1.

14. The method according to claim 11, wherein the first resin component has an acid number of 25 to 65.

15. The method according to claim 4, wherein the first resin component comprises a molecule selected from the group consisting of an epoxy acrylate or epoxy ($C_{1-4}$) acrylate and an epoxy resin which is an aromatic polyglycidyl ether having a molecular structure represented by:

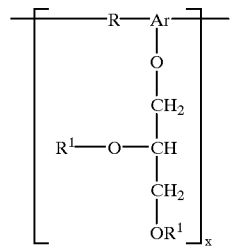

wherein Ar is an aromatic group having from 1 to 4 phenyl rings;

R is selected from the group consisting of a divalent hydrocarbon group having from 1 to 10 carbon atoms, 0, $N(R^2)$ and mixtures thereof, wherein $R^2$ is selected from the group consisting of H and a $C_{1-4}$ hydrocarbon group; and each group represented by $R^1$ is selected from the group consisting of H, acidic functional groups, ethylenically unsaturated groups and mixtures thereof, the groups represented by $R^1$ being selected such that H is at most 30% of the total number of R¹ groups, wherein the number of groups represented by R¹ that are acidic functional groups is sufficient to provide aqueous alkaline developability, and wherein the remainder of the groups represented by R¹ are ethylenically unsaturated groups; and x is 2 to 10.

16. The method according to claim 11, wherein the acidic groups providing the acid number are carboxylic acid groups and the photopolymerisable groups have a formula represented by: —C(R³)=C(R³)₂, wherein R³ is selected from the group consisting of H, CH₃, and combinations thereof such that at least two of the R³ groups are H.

17. The method according to claim 16, wherein the first resin component comprises an aromatic polyglycidyl ether with at most 30% of the R¹ groups being H, from 4 weight percent to 95 weight percent of the R¹ groups being acidic functional groups having the formula —C(O) —OH, and from 4 weight percent 95 weight percent of the R¹ groups being ethylenically unsaturated groups.

18. The process according to claim 11, wherein the first resin mixture is selected from the group consisting of epoxy-novolac resins, bisphenol A glycidyl prepolymers, bisphenol F diglycidyl ether prepolymers, bisphenol H diglycidyl prepolymers and mixtures thereof.

19. The process according to claim 11, wherein the first resin mixture has a softening point of from 60° to 90° C.

20. A method of manufacturing a multilayer circuit board, the process comprising the steps of:
(A) providing a first layer including an insulating sublayer and a conducting sublayer;
(B) providing a first resin component comprising an aromatic polyglycidyl ether having an acid number of from 25 to 65 and a molecular structure represented by;

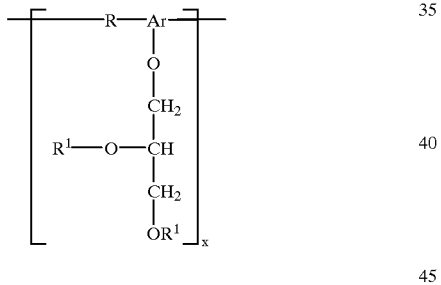

wherein Ar is an aromatic group having from 1 to 4 phenyl rings;
R is selected from the group consisting of a divalent hydrocarbon group having from 1 to 10 carbon atoms, O, N(R²) and mixtures thereof, wherein R² is selected from the group consisting of H and a C₁₋₄ hydrocarbon group; and each of the groups represented by R¹ is selected from the group consisting of H, acidic functional groups, ethylenically unsaturated groups and mixtures thereof, the groups represented by R¹ being selected such that H is at most 30% of the total number of R¹ groups, wherein the number of groups represented by R¹ that are acidic functional groups is sufficient to provide aqueous alkaline developability, and wherein the remainder of the groups represented by R¹ are ethylenically unsaturated groups, and wherein from 4 weight percent to 95 weight percent of the R¹ groups are acidic functional groups having the formula —C(O)—OH, and from 4 weight percent 95 weight percent of the R¹ groups are ethylenically unsaturated groups; and x is 2 to 10;

(C) providing a resin mixture having a softening point of from 60° C. to 90° C. and including a free radical polymerization photoinitiator and a molecule selected from the group consisting of epoxy-novolac resins, bisphenol A glycidyl prepolymers, bisphenol F diglycidyl ether prepolymers, bisphenol H diglycidyl prepolymers and mixtures thereof;

(D) combining the first resin component and the resin mixture to form a resin composition having from 50 weight percent to 94 weight percent of the first resin component and from 5 weight percent to 49 weight percent of the molecule having unreacted epoxide groups such that a weight ratio of the first resin component to the molecule having unreacted epoxide groups is 3:1 wherein the weight percentages are based upon the total weight of the resin composition;

(E) applying the resin composition to a surface of the conducting sub-layer to form a resin composition layer that is etchable;

(F) forming areas of the resin composition layer that are etch-resistant and leaving areas of the resin composition layer that are etchable;

(G) contacting the etchable areas of the resin composition layer with an aqueous developing composition to remove the etchable areas of the resin composition layer to reveal areas of the conducting sublayer;

(H) etching the revealed areas of the conducting sublayer;

(I) contacting a second layer with a surface of the etch-resistant areas of the resin composition layer; and (J) adhering the first layer to the second layer to form the multilayer circuit board.

* * * * *

UNITED STATES PATENT AND TRADEMARK OFFICE
CERTIFICATE OF CORRECTION

PATENT NO.   : 6,074,803
DATED        : June 13, 2000
INVENTOR(S)  : Peter Thomas McGrath It is certified that error appears in the above-identified patent and that said Letters Patent is hereby corrected as shown below:

Column 1,
Line 15, "PCR" should be "PCB".

Column 3,
Line 15, the word "in" should be changed to "is".
Line 46, "Klove" should be changed to " W. Klose".
Line 56, the word "in" should be changed to "is".

Column 5,
Line 38, the word "in" should be changed to "is".

Column 6,
Line 50, the word "an" should be changed to "as".

Column 7,
Line 65, the word "or" should be changed to "for"

Column 9,
Line 50, change "CH=CH$_3$" to CH=CH$_2$".

Column 11,
Line 5, change "in" to "10".

UNITED STATES PATENT AND TRADEMARK OFFICE
CERTIFICATE OF CORRECTION

PATENT NO.    : 6,074,803
DATED         : June 13, 2000
INVENTOR(S)   : Peter Thomas McGrath It is certified that error appears in the above-identified patent and that said Letters Patent is hereby corrected as shown below:

<u>Column 13</u>,
Line 54, change "or" to "of".

<u>Column 16</u>,
Line 20, change "a" to "A".

Signed and Sealed this

Fourteenth Day of August, 2001

*Attest:*

*Attesting Officer*

NICHOLAS P. GODICI
*Acting Director of the United States Patent and Trademark Office*